United States Patent [19]

Hsieh et al.

[11] Patent Number: 6,153,494
[45] Date of Patent: Nov. 28, 2000

[54] METHOD TO INCREASE THE COUPLING RATIO OF WORD LINE TO FLOATING GATE BY LATERAL COUPLING IN STACKED-GATE FLASH

[75] Inventors: Chia-Ta Hsieh, Tainan; Di-Son Kuo, Hsinchu; Yai-Fen Lin, Chung-Hsing Village; Chrong Jung Lin, Hsin-Tien; Jong Chen, Taipei; Hung-Der Su, Lu-Zu Country, all of Taiwan

[73] Assignee: Taiwan Semiconductor Manufacturing Company, Hsin-Chu, Taiwan

[21] Appl. No.: 09/310,257

[22] Filed: May 12, 1999

[51] Int. Cl.$^7$ .................................................. H01L 21/76
[52] U.S. Cl. ..................... 438/424; 438/257; 438/294; 438/296; 438/211
[58] Field of Search .................... 438/211, 218, 438/221, 201, 435, 424, 294, 296, 257

[56] References Cited

U.S. PATENT DOCUMENTS

| | | | |
|---|---|---|---|
| 5,412,238 | 5/1995 | Chang | 365/185.16 |
| 5,480,821 | 1/1996 | Chang | 438/261 |
| 5,569,945 | 10/1996 | Hong | 257/316 |
| 5,596,213 | 1/1997 | Lee | 257/316 |
| 5,643,813 | 7/1997 | Acocella et al. | 438/593 |
| 5,644,532 | 7/1997 | Chang | 365/185.16 |
| 5,686,333 | 11/1997 | Sato | 438/257 |
| 6,001,706 | 12/1999 | Tan et al. | 438/424 |
| 6,022,781 | 2/2000 | Noble, Jr. et al. | 438/296 |
| 6,034,393 | 3/2000 | Sakamoto et al. | 257/315 |
| 6,040,232 | 3/2000 | Gau | 438/424 |
| 6,069,382 | 5/2000 | Rahim | 257/316 |

OTHER PUBLICATIONS

Anonymous, "Flash Memory Cell using the RSTI (Raised Shallow Trench Isolation)", May 1998, Research Disclosure 409142, pp. 651–652.

*Primary Examiner*—Stephen D. Meier
*Assistant Examiner*—Jamie L. Davis
*Attorney, Agent, or Firm*—George O. Saile; Stephen B. Ackerman

[57] ABSTRACT

A method is provided for forming a stacked-gate flash memory cell having a shallow trench isolation with a high-step of oxide and high lateral coupling. This is accomplished by first depositing an unconventionally high or thick layer of nitride and then forming a shallow trench isolation (STI) through the nitride layer into the substrate, filling the STI with isolation oxide, removing the nitride thus leaving behind a deep opening about the filled STI, filling conformally the opening with a first polysilicon layer to form a floating gate, forming interpoly oxide layer over the floating gate, and then forming a second polysilicon layer to form the control gate and finally forming the self-aligned source of the stacked-gate flash memory cell of the invention. A stacked-gate flash memory cell is also provided having a shallow trench isolation with a high-step of oxide and high lateral coupling.

28 Claims, 7 Drawing Sheets

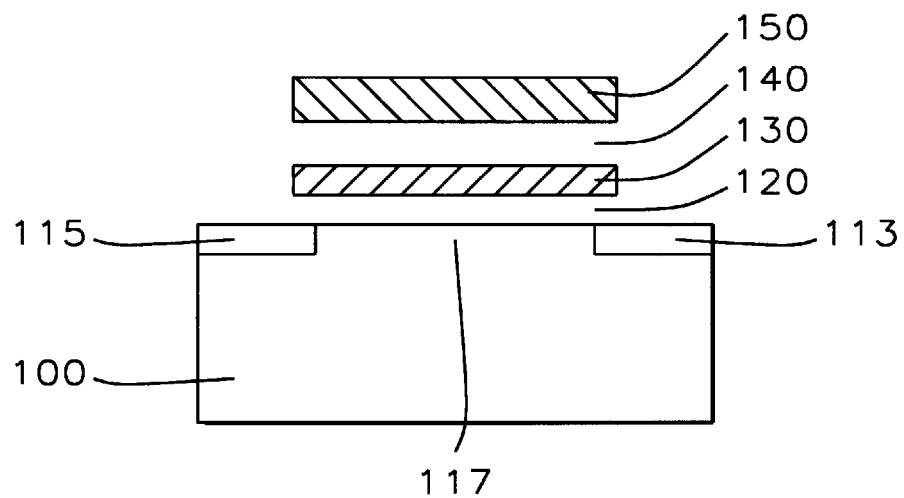
*FIG. 1 - Prior Art*
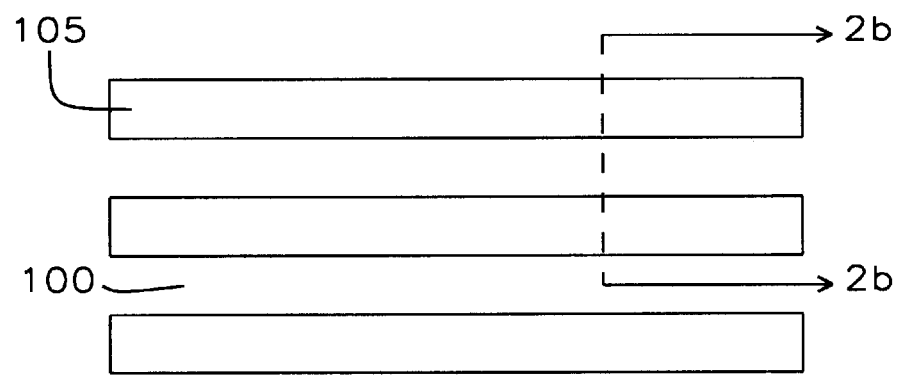
*FIG. 2a*

METHOD TO INCREASE THE COUPLING RATIO OF WORD LINE TO FLOATING GATE BY LATERAL COUPLING IN STACKED-GATE FLASH

BACKGROUND OF THE INVENTION (1) Field of the Invention

The present invention relates to the manufacturing of semiconductor memories, and in particular, directed to a stacked-gate flash memory having a shallow trench isolation with a high step and high lateral coupling and to a method of forming the same.

(2) Description of the Related Art

One of the thrusts in trying to gain programming and erase speeds in stacked-gate flash memories is to increase the coupling ratios. Thinner inter-poly oxides can indeed support higher coupling ratios between the word line and the floating gate, however, data retention becomes a concern due to leakages. Furthermore, word line voltages have been increased to increase programming and erase speeds. But, without the supporting larger area, which is provided in this invention, the situation has exacerbated the well-known problem of junction break-down. It is shown later in the embodiments of this invention that larger area can be achieved between the word line and the floating gate by advantageously introducing a step-up in the shallow trench isolation in a stacked-gate flash memory cell.

The importance of data retention capacity and the coupling ratio in a memory cell has been well recognized since the advent of the one-transistor cell memory cell with one capacitor. Over the years, many variations of this simple cell have been advanced for the purposes of shrinking the size of the cell and, at the same time, improving its performance. The variations consist of different methods of forming capacitors, with single, double or triple layers of polysilicon, and different materials for the word and bit lines.

Memory devices include electrically erasable and electrically programmable read-only memories (EEPROMs) of flash electrically erasable and electrically programmable read-only memories (flash EEPROMs). Generally, flash EEPROM cells having both functions of electrical programming and erasing may be classified into two categories, namely, a stack-gate structure and a stacked-gate structure. A conventional stack-gate type cell is shown in FIG. 1 where, as is well known, tunnel oxide film (120), a floating gate (130), an interpoly insulating film (140) and a control gate (150) are sequentially stacked on a silicon substrate (100) between a drain region (113) and a source region (115) separated by channel region (117). Substrate (100) and channel region (117) are of a first conductivity type, and the first (113) and second (115) doped regions are of a second conductivity type that is opposite the first conductivity type.

The programming and erasing of an EEPROM is accomplished electrically and in-circuit by using Fowler-Nordheim (F-N) tunneling mentioned above. Basically, a sufficiently high voltage is applied to control gate (150) and drain (113) while source (115) is grounded to create a flow of electrons in channel region (117) in substrate (100). Some of these electrons gain enough energy to transfer from the substrate to control gate (150) through thin gate oxide layer (120) by means of (F-N) tunneling. The tunneling is achieved by raising the voltage level on control gate (150) to a sufficiently high value of about 12 volts. As the electronic charge builds up on floating gate (130), the electric field is reduced, which reduces the electron flow. When, finally, the high voltage is removed, floating gate (130) remains charged to a value larger than the threshold voltage of a logic high that would turn it on. Thus, even when a logic high is applied to the control gate, the EEPROM remains off. Since tunneling process is reversible, floating gate (130) can be erased by grounding control gate (150) and raising the drain voltage, thereby causing the stored charge on the floating gate to flow back to the substrate. Of importance in the tunneling region is the quality and the thinness of the tunneling oxide separating the floating gate from the substrate.

The thicknesses of the various portions of the oxide layers on the stacked-gate side (between the control gate and the source) and the stacked-side (between the floating gate and the drain) of the memory cell of FIG. 1b play an important role in determining such parameters as current consumption, coupling ratio and the memory erase-write speed, especially in an environment where feature sizes in advanced integrated circuits are being scaled down at a rapid rate. In prior art, various methods have been developed to address these parameters. For example, EPROMs having a trench-like coupling capacitors have been disclosed to address the shrinking area of the gate electrodes, and hence the capacitive coupling ratio between the floating gate and control gates on a conventional prior art EPROM.

In U.S. Pat. No. 5,480,821, Chang discloses a method of fabricating source-coupling, stacked-gate, virtual ground flash EEPROM array where a poly1 floating gate of a cell is formed over a first portion of a channel region in the substrate and is separated from the channel region by a layer of floating gate oxide. Each floating gate includes a tunneling arm that extends over the cell's source line and is separated therefrom by thin tunnel oxide. A poly2 word line is formed over the floating gates of the storage cells in each row of the array. The poly2 word line is separated from the underlying floating gate by a layer of oxide/nitride/oxide ONO. The word lines run perpendicular to the buried n+ bit lines and extend over a second portion of the channel region of each cell in the row to define the internal access transistor of the cell. The word line is separated from the second portion of the channel region by the ONO layer. Chang also discloses the same flash EEPROM array in U.S. Pat. No. 5,412,238 as well as a method for programming the same in U.S. Pat. No. 5,644,532.

Hong, also discloses a stepped floating gate EEPROM device in U.S. Pat. No. 5,569,945 with a high coupling ratio. The fabrication comprises forming a dielectric layer on a substrate and a sacrificial structure on portions of the dielectric layer, forming a first polysilicon layer over the sacrificial structure and other exposed surfaces of the device, patterning the first polysilicon layer and the dielectric layer by masking and etching to form a stepped electrode structure partially upon the sacrificial structure and partially upon the other exposed surfaces of the device, applying ion implantation into the substrate outside of the area covered by the stepped electrode structure, removing the sacrificial layer from the surface of the substrate and from beneath the stepped electrode structure, forming a second layer of dielectric material on the exposed surfaces of the stepped electrode structure and the substrate, and forming a second polysilicon layer over and under overhanging portions the second layer of dielectric material and the substrate.

Sato discloses a nonvolatile semiconductor memory device in which the overlap area of the control gate electrode and the floating gate electrode is increased without increasing the area of the memory cell, and a method of producing the same in U.S. Pat. No. 5,686,333.

Acocella, et al., in U.S. Pat. No. 5,643,813 show improved packing density as well as improved performance and higher manufacturing yields by confining floating gate structures between isolation structures covered with a thin nitride layer.

In the present invention, a method to increase the coupling ratio of word line to floating gate is disclosed. This is accomplished by providing a step-up in the shallow trench isolation in a stacked-gate flash memory cell without any increase in the lateral dimensions of the cell.

SUMMARY OF THE INVENTION

It is therefore an object of this invention to provide a method of forming a stacked-gate flash memory having an increased coupling ratio between the word line and the floating gate.

It is still another object of this invention to provide a method of forming a stacked-gate flash memory having a shallow trench isolation with a high-step in order to increase the lateral coupling between the word line and the floating gate.

It is an overall object of this invention to provide a stacked-gate flash memory cell having a shallow trench isolation with a high-step, reduced size, and increased coupling between the control gate and the floating gate of the cell. coupling between the control gate and the floating gate of the cell.

These objects are accomplished by providing a semiconductor substrate; forming a pad oxide layer over said substrate; forming a high nitride layer over said pad oxide layer; forming and patterning a first photoresist layer over said first nitride layer to define active regions in said substrate; forming a trench in said substrate by etching through patterns in said first photoresist layer; removing said first photoresist layer; forming a conformal lining on the inside walls of said trench; depositing isolation oxide inside said trench to form shallow trench isolation (STI) with a high-step oxide; performing chemical-mechanical polishing of said substrate; removing said nitride layer, thus forming openings between said high-steps of said STI; removing said pad oxide layer at the bottom of said openings between said high-steps of said STI; forming sacrificial oxide layer over said substrate; removing said sacrificial oxide layer; growing floating gate oxide layer over said substrate; forming first polysilicon layer conformally filling said openings between said high-steps of said STI; forming and patterning a second photoresist layer over said substrate to define said first polysilicon layer and form floating gate regions in said substrate; etching said first polysilicon layer to form floating gates; removing said second photoresist layer; forming interpoly oxide over said floating gate; forming a second polysilicon layer over said interpoly oxide layer; forming and patterning a third photoresist layer over said interpoly oxide layer to define control gate and word line; etching through said patterning in third photoresist layer to form said word line; removing said third photoresist layer; forming and patterning a fourth photoresist layer over said substrate to define self-aligned source (SAS) regions in said substrate; etching said SAS regions; and removing said fourth photoresist layer.

These objects are further accomplished by providing a stacked-gate flash memory cell having a trench with a high-step oxide; a conformal layer lining the inside walls of said trench; an opening adjacent to said trench with a high-step oxide; a first polysilicon layer conformally lining said opening including high-step oxide of said trench to form a floating gate; an ONO layer covering said substrate including walls of said floating gate lining said opening; a second polysilicon layer covering said ONO layer to form a control gate; and a self-aligned source (SAS) line.

BRIEF DESCRIPTION OF THE DRAWINGS

FIG. 1 is a cross-sectional view of a conventional stacked-gate type memory cell of prior art.

FIG. 2a is a top view of a substrate showing regions of shallow trench isolation (STI), according to the present invention.

DESCRIPTION OF THE PREFERRED EMBODIMENTS

Figure 2B:
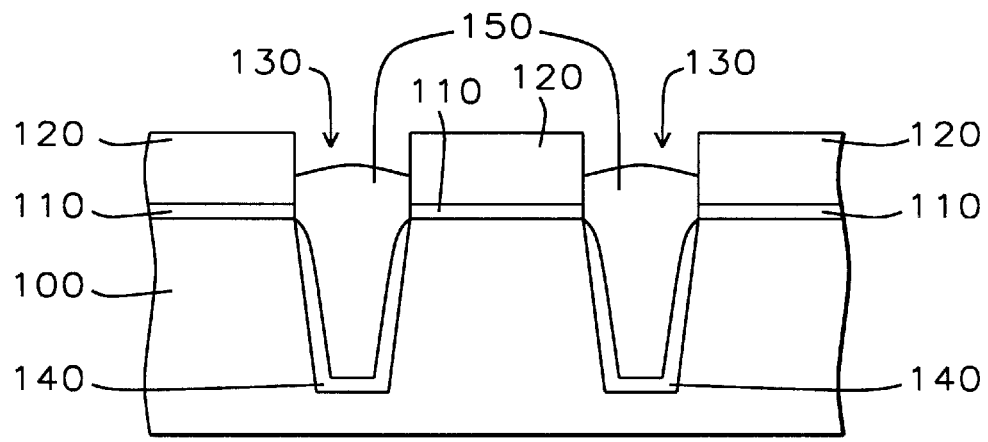
FIG. 2b is a cross-sectional view of substrate of FIG. 2a showing the forming of STI in the substrate through a layer of nitride, oxide lining on the walls of the STI and the isolation oxide that is deposited into the STI, according to this invention.

Referring now to the drawings, specifically to FIGS. 3a–3g, there is shown a preferred method of forming a stacked-gate flash memory having a shallow trench isolation (STI) with a high-step of oxide and high lateral coupling. FIGS. 2a–2f show the present state of manufacturing a stacked-gate flash memory cell. It will be apparent that the stacked-gate of FIGS. 2a–2f lack the high-step oxide of the preferred embodiment as claimed later.

FIG. 2a shows top view of a semiconductor substrate (100) where trenches (105) are to be formed. A cross-sectional view of a trench (130) is shown in FIG. 2b. First, a layer of pad oxide (110), better seen in the cross-sectional view, is formed over the substrate. Pad oxide layer may be formed by using chemical CVD $SiO_2$, or grown thermally.

Next, normally a 100–200 nanometer (nm) thick layer of nitride (120) is formed over the pad oxide to serve as an oxidation mask. Usually, nitride is formed by reacting dichlorosilane ($SiCl_2H_2$) with ammonia ($NH_3$) in an LPCVD at a pressure between about 0.25 to 1.0 torr, temperature between about 650 to 750° C. and at flow rates between about 80 to 120 sccm. It will be disclosed later in the preferred embodiment that the nitride thickness that is taught here is much higher or thicker than what is normally used in prior art.

The active regions are next defined with a photolithographic step and field regions grown, as is well known in the art. A photoresist pattern is normally used to protect all areas on which active devices will later be formed. The nitride layer is then dry etched, and the pad oxide may be etched by means of either a dry-or wet-chemical process. The etching is further carried into the substrate to form the shallow trench (130) that is shown in FIG. 2b. The photoresist layer is next removed by oxygen plasma ashing and then the inside walls of trench (130) is lined with an oxide by thermal growth. Subsequently, the trench is filled with isolation oxide (150), thus forming shallow trench isolation (STI) as shown in FIG. 2b. Next, the substrate is subjected to chemical-mechanical polishing (CMP) after which the nitride layer is removed. The removal of nitride layer can be accomplished in a high-density-plasma (HDP) etcher with etch recipe comprising gases $O_2$, $SO_2$, $CF_4$ and He at flow rates between about 10 to 250, 10 to 80, 0 to 50 sccm and 40 to 80 sccm, respectively. The pad oxide layer (110) underlying nitride layer (120) is also removed by using either a dry- or -wet etch, thus leaving apertures or openings in between the isolation oxide "caps" (150) that protrude above the STI (130).

Figure 2C:
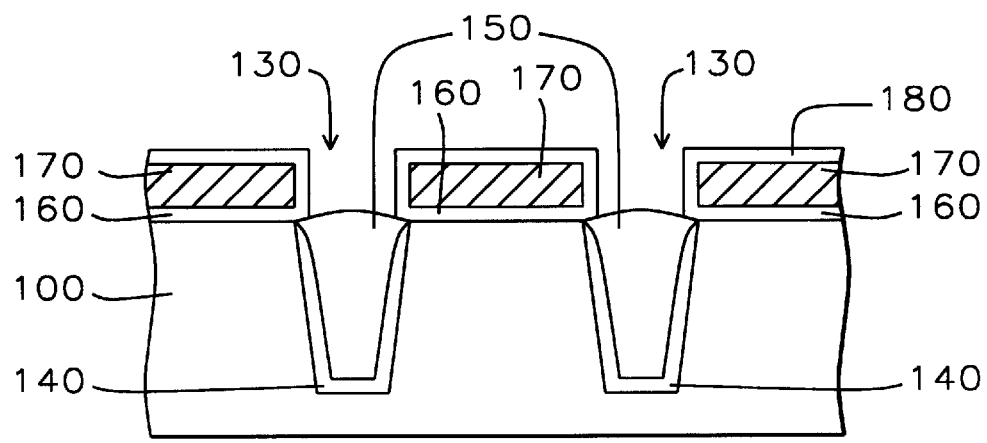
FIG. 2c is a cross-sectional view of the substrate of FIG. 2a showing the forming of the floating gate and the interpoly oxide, according to this invention.

Next, floating gate oxide layer (160) is grown over the substrate, as shown in FIG. 2c. Subsequently, a first polysilicon layer (170), later to be formed into a floating gate, is deposited over the gate oxide layer. Polysilicon is formed through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials. The floating gates are next defined by patterning a photoresist layer over the polysilicon layer and the floating gates formed by etching the first polysilicon layer exposed through the patterns in the photoresist layer, after which the photoresist layer is removed.

Figure 2D:
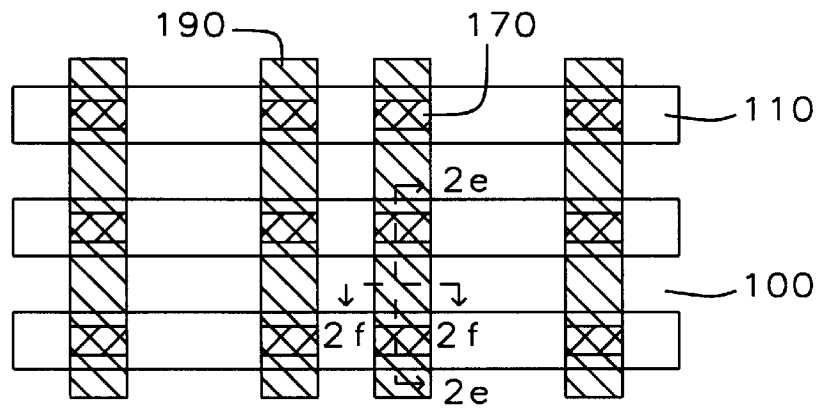
FIG. 2d is a top view of the substrate of FIG. 2c showing the relative positions of the floating gates with respect to the control gates of this invention.
Figure 2E:
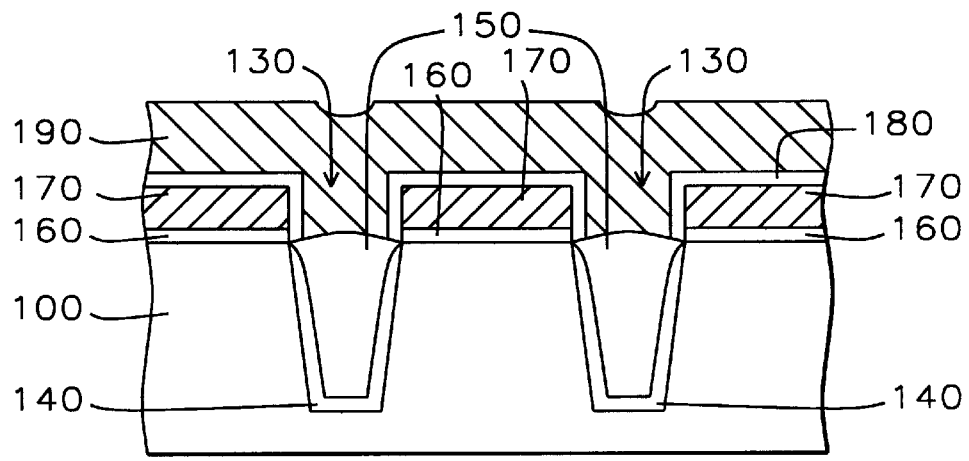
FIG. 2e is a cross-sectional view of the substrate of FIG. 2e showing the forming of the second polysilicon layer to be formed as the control gate of this invention.
Figure 2F:
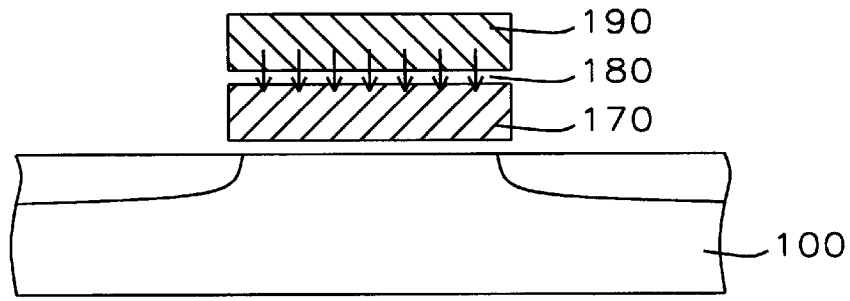
FIG. 2f is a cross-sectional view of the substrate of FIG. 2e showing the forming of a stacked-gate memory cell, according to this invention.

An interpoly oxide (180) is next formed over the floating gate as shown in FIG. 2c, and then a second polysilicon layer (190) is formed over the interpoly oxide as shown both in the top view of the substrate in FIG. 2d, as well as the cross-sectional view, FIG. 2e. Thus, a stacked-gate as shown in the cross-sectional view of FIG. 2f, is formed.

Figure 3A:
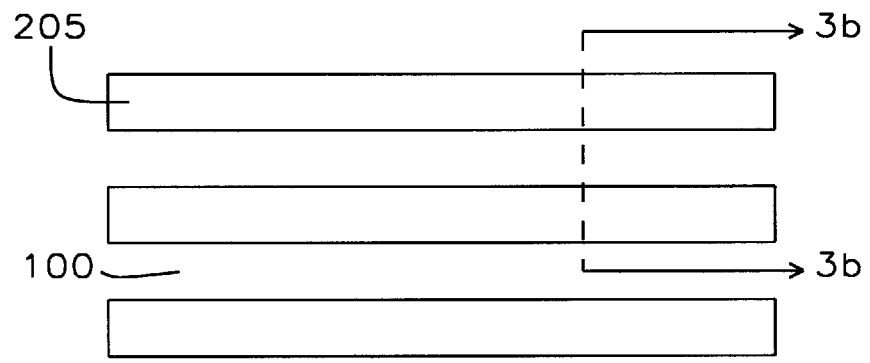
FIG. 3a is a top view of a substrate showing regions of shallow trench isolation (STI), according to the preferred embodiment of this invention.
Figure 3B:
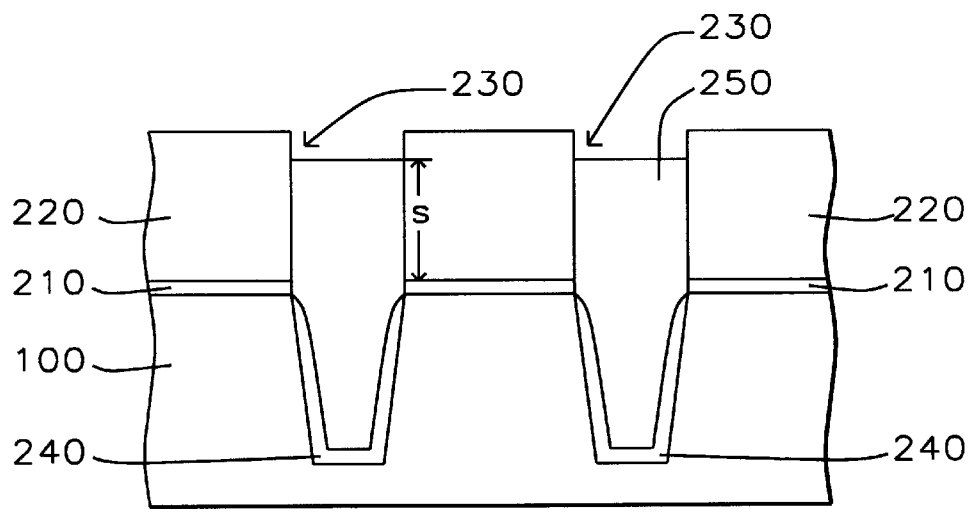
FIG. 3b is a cross-sectional view of substrate of FIG. 3a showing the forming of STI in the substrate through a layer of a thick layer of nitride, oxide lining on the walls of the STI, isolation oxide deposited into the STI, and a high-step oxide protruding above the STI of this invention.

The preferred embodiment shown in FIGS. 3a–3g differ from the present state of the art in that the nitride layer used is much higher or thicker than what is conventionally practiced. Thus, in FIG. 3a, the top view of substrate (100), shows regions (205) where shallow trench isolation (STI) are to be formed. First, a layer of pad oxide (210), better seen in the cross-sectional view, FIG. 3b, is formed over the substrate. Pad oxide layer may be formed by using chemical CVD $SiO_2$, but it is preferred that it be grown thermally at a temperature range between about 850 to 950° C., and to a thickness between about 100 to 250 Å.

Next, as a main feature and key aspect of the present invention, a relatively high or thick layer of nitride (220) is formed over the pad oxide. Preferably, the thickness of nitride layer (220) is between about 2000 to 6000 Å. It will be apparent later that this thick nitride layer will provide a high-step above the STI to form a floating gate having a high coupling ratio with the control gate to be formed. It is preferred that the nitride layer is formed by reacting dichlorosilane ($SiCl_2H_2$) with ammonia ($NH_3$) in an LPCVD at a temperature range between about 750 to 850° C.

The active regions are next defined with a first photolithographic step (not shown) and field regions grown, as is conventionally performed. A photoresist mask of a thickness between about 0.8 to 1.0 micrometers ($\mu$m) is normally used to protect all areas on which active devices will later be formed. The nitride layer is then dry etched, preferably using a recipe comprising $SF_6$ and $O_2$ gases and the underlying pad oxide is also dry etched using gases $CHF_3$, $CF_4$, $O_2$. The etching is further carried into the substrate to form shallow trench (230) that is shown in FIG. 3b by using a recipe comprising $Cl_2$ and HBr.

The first photoresist layer is next removed by oxygen plasma ashing and then the inside walls of trench (230) is lined with an oxide layer (240) by thermal growth, preferably at a temperature between about 850 to 950° C. Subsequently, the trench is filled with isolation oxide (250), using the method of high density plasma (HDP) deposition or LPCVD oxide, thus forming shallow trench isolation (STI) as shown in FIG. 3b. Next, the substrate is subjected to chemical-mechanical polishing (CMP).

It will be noted in FIG. 3b that the oxide step height (s) is exceptionally high. This high-step oxide preferably has a thickness between about 3000 to 7000 Å, which is then reduced to between about 2000 to 6000 Å after chemical-mechanical polishing. Thus, when, at the next step, nitride layer (220) is removed, a deep opening (235) is left behind. Nitride removal is accomplished using phosphoric acid, $H_3PO_4$. Pad oxide layer (210) underlying nitride layer (220) is also removed preferably by using wet etch, thus leaving openings (235) in between the isolation oxide "caps"(250) that protrude above the STI (230).

Figure 3C:
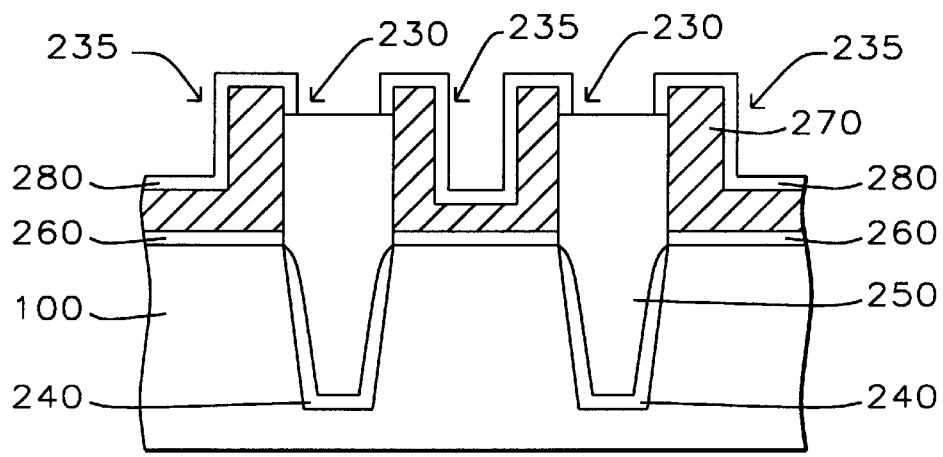
FIG. 3c is a cross-sectional view of the substrate of FIG. 3b showing the conformal forming of the floating gate about the high-step oxide of this invention, and the interpoly oxide formed over the contours of the floating gate of this invention.
Figure 3D:
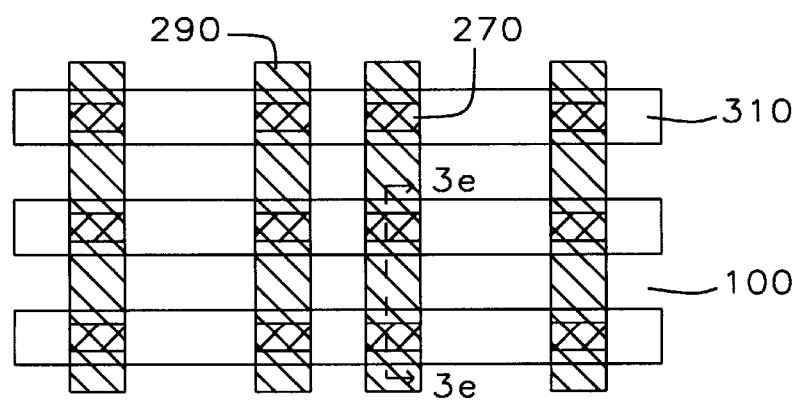
FIG. 3d is a top view of the substrate of FIG. 3c showing the relative positions of the floating gates with respect to the control gates of this invention.

Next, floating gate oxide layer (260) is grown over the substrate, at a temperature between about 780 to 900° C., as shown in FIG. 3c. Subsequently, a first polysilicon layer (270), to serve as a floating gate, is deposited over the substrate. As another key aspect of the present invention, first polysilicon layer is conformally deposited so as to follow the contours of the openings (235), thus providing additional surface to the control gate (290) that is to be formed later. In another words, the polysilicon should not fill totally the openings (235). This is accomplished preferably through a LPCVD method employing silane $SiH_4$ as a silicon source material at a temperature range between about 500 to 650° C. The floating gates are next defined by patterning a second photoresist layer of thickness between about 1.0 to 1.2 $\mu$m (not shown) over the first polysilicon layer and the floating gates formed by etching the first polysilicon layer exposed through the patterns in the photoresist layer, after which the photoresist layer is removed.

An interpoly oxide (280) is next formed over the contours of the conformal floating gate as shown in FIG. 3c. It is preferred that the interpoly oxide comprises oxide/nitride/ oxide (ONO) formed through methods known in the art. Then, a second polysilicon layer (290) is formed over the interpoly oxide as shown both in the top view of the substrate in FIG. 3d, as well as the cross-sectional view, FIG. 3e. A third photoresist layer (not shown) is then used to form the control gate and word line (290) shown in FIG. 3e. A still another fourth photoresist layer (not shown) is used to define the self-aligned source (SAS) to form a common source line (200) shown in the top view of FIG. 3f. Thus, a stacked-gate as shown in the cross-sectional view of FIG. 3g, is formed.

Figure 3E:
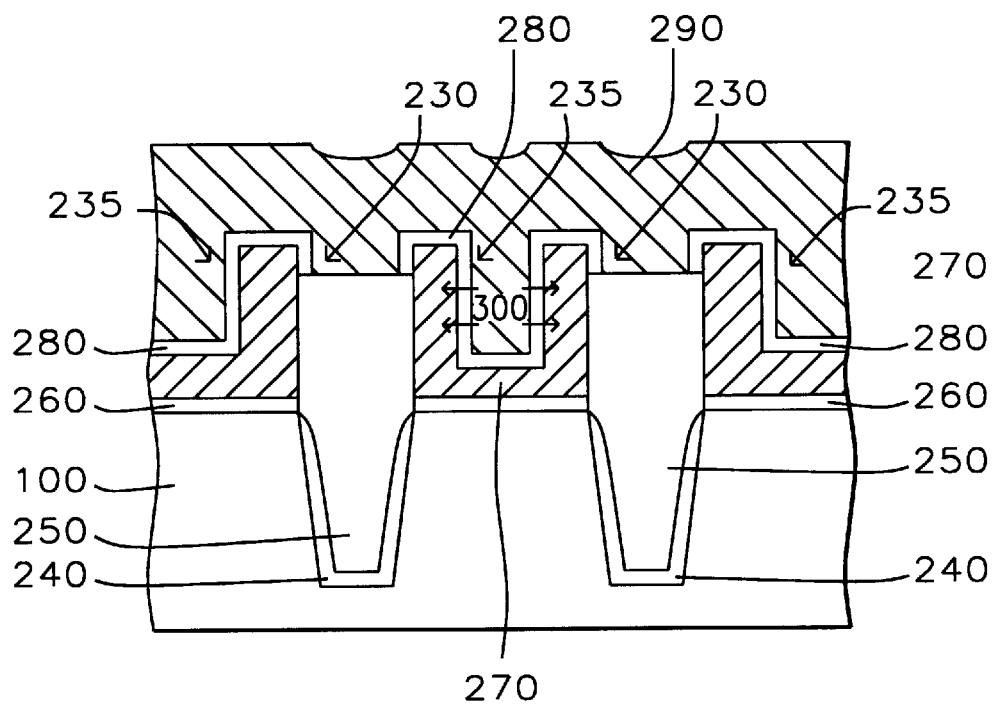
FIG. 3e is a cross-sectional view of the substrate of FIG. 3d showing the forming of the second polysilicon layer to be formed as the control gate of this invention.
Figure 3F:
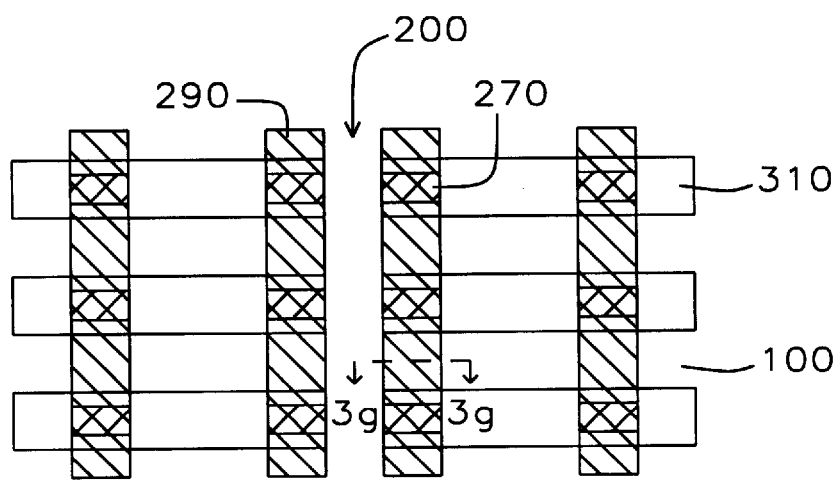
FIG. 3f is a top view of the substrate of FIG. 3e showing the forming of a common source line in the SAS region, according to this invention.
Figure 3G:
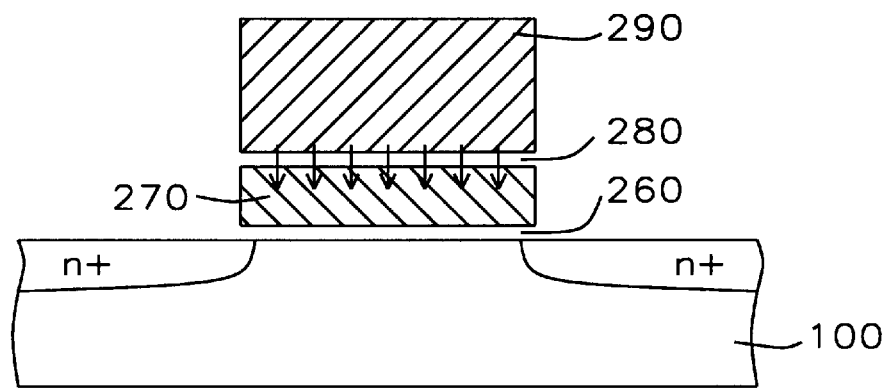
FIG. 3g is a cross-sectional view of the substrate of FIG. 3f showing the forming of a stacked-gate memory cell of this invention having an extra area that is available due to the higher or "folding" sidewalls of the floating gate formed against the high-step oxide protruding over the STI, without an increase in the lateral dimensions of the memory cell of this invention.

A comparison of FIG. 3e with FIG. 2e show that the lateral coupling between word line of control gate (290) and floating gate (270) of the preferred embodiment is stronger, by virtue of the additional coupling (300) provided by the extra area that is available due to the higher and "folding" sidewalls of the floating gate formed against the high-step oxide protruding over the shallow trench isolation trench of the present invention.

It has been disclosed in the present invention a stacked-gate flash memory cell having a shallow trench isolation with a high-step of oxide and high lateral coupling. Though numerous details of the disclosed method are set forth here, such as a specific height or thickness of nitride layer to provide an understanding of the present invention, it will be obvious, however, to those skilled in the art that these specific details need not be employed to practice the present invention. At the same time, it will be evident that the same methods may be employed in other similar process steps, such as, for example, in shrinking cell size further by providing even a higher step for the formation of a floating gate with additional lateral area.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of forming a stacked-gate flash memory having a shallow trench isolation with a high-step oxide and high lateral coupling comprising the steps of:

providing a semiconductor substrate;

forming a pad oxide layer over said substrate;

forming a high nitride layer over said pad oxide layer;

forming and patterning a first photoresist layer over said high nitride layer to define active regions in said substrate;

forming a trench in said substrate by etching through patterns in said first photoresist layer;

removing said first photoresist layer;

forming a conformal lining on the inside walls of said trench;

depositing isolation oxide inside said trench to form shallow trench isolation (STI) with a high-step oxide;

performing chemical-mechanical polishing of said substrate;

removing said nitride layer, to form high steps;

removing said pad oxide layer at the bottom of said high steps;

after removing said pad oxide layer, forming sacrificial oxide layer over said substrate;

removing after forming the sacrificial oxide layer, said sacrificial oxide layer;

growing floating gate oxide layer over said substrate;

forming a first polysilicon layer conformally over said high steps;

forming and patterning a second photoresist layer over said substrate to define said first polysilicon layer and form floating gate regions in said substrate;

etching said first polysilicon layer to form floating gates;

removing said second photoresist layer;

forming interpoly oxide over said floating gates;

forming a second polysilicon layer over said interpoly oxide layer;

forming and patterning a third photoresist layer over said interpoly oxide layer to define control gate and word line;

etching through said patterning in third photoresist layer to form said word line;

removing said third photoresist layer;

forming and patterning a fourth photoresist layer over said substrate to define self-aligned source (SAS) regions in said substrate;

etching said SAS regions; and removing said fourth photoresist layer.

2. The method of claim 1, wherein said semiconductor substrate is silicon.

3. The method of claim 1, wherein said forming pad oxide layer is accomplished by thermal growth at a temperature between about 850 to 950° C.

4. The method of claim 1, wherein said pad oxide layer has a thickness between about 100 to 250 angstroms (Å).

5. The method of claim 1, wherein said forming said high nitride layer over said pad oxide layer is accomplished by CVD at a temperature between about 750 to 850° C. by reacting dichlorosilane ($SiCl_2H_2$) with ammonia ($NH_3$).

6. The method of claim 1, wherein the thickness of said high nitride layer is between about 2000 to 6000 Å.

7. The method of claim 1, wherein said first photoresist layer has a thickness between about 0.8 to 1.0 $\mu$m.

8. The method of claim 1, wherein said forming a trench in said substrate by etching through patterns in said first photoresist layer into said substrate is accomplished with etch recipe comprising gases Ar, $CHF_3$, $C_4F_8$.

9. The method of claim 1, wherein said trench has a depth between about 2500 to 5000 Å.

10. The method of claim 1, wherein said removing said first photoresist layer is accomplished by oxygen plasma ashing.

11. The method of claim 1, wherein said conformal lining comprises an oxide having a thickness between about 100 to 450 Å.

12. The method of claim 1, wherein said depositing said isolation oxide inside said trench to form shallow trench isolation (STI) with a high-step oxide is accomplished by using LPCVD or HDP methods.

13. The method of claim 12, wherein the thickness of said high-step oxide above said trench is between about 3000 to 7000 Å which is then reduced to between about 2000 to 6000 Å through chemical-mechanical polishing.

14. The method of claim 1, wherein said removing said nitride layer forming openings between said high-steps of said STI is accomplished with an etch recipe comprising gases $SF_6$ and $O_2$.

15. The method of claim 1, wherein said removing said pad oxide layer at the bottom of said openings between said high-steps of said STI is accomplished with a recipe comprising gases $CHF_3$, $CF_4$ and $O_2$.

16. The method of claim 1, wherein said forming sacrificial oxide layer over said substrate is accomplished through thermal growth.

17. The method of claim 1, wherein said removing said sacrificial oxide is accomplished with a recipe comprising gas $SF_6$.

18. The method of claim 1, wherein said growing floating gate oxide layer over said substrate is accomplished by thermal growth at a temperature between about 780 to 900° C.

19. The method of claim 1, wherein said forming a first polysilicon layer is accomplished with silicon source $SiH_4$ using LPCVD at a temperature between about 500 to 650° C.

20. The method of claim 1, wherein said first polysilicon layer has a thickness between about 100 to 500 Å.

21. The method of claim 1, wherein said second photoresist layer has a thickness between about 1.0 to 1.2 µm.

22. The method of claim 1, wherein said etching said first polysilicon layer is accomplished with a recipe comprising $Cl_2$, HBr and $O_2$.

23. The method of claim 1, wherein said interpoly oxide layer comprises oxide/nitride/oxide (ONO) having a thickness between about 130 to 250 Å.

24. The method of claim 1, wherein said forming a second polysilicon layer is accomplished with silicon source $SiH_4$ using LPCVD at a temperature between about 500 to 650° C.

25. The method of claim 1, wherein said second polysilicon layer has a thickness between about 1000 to 3000 Å.

26. The method of claim 1, wherein said third photoresist layer has a thickness between about 1.0 to 1.2 Å.

27. The method of claim 1, wherein said etching through said patterning in third photoresist layer to form said word line is accomplished with a recipe comprising $Cl_2$, HBr, $O_2$ and $C_2H_6$.

28. The method of claim 1, wherein said etching said SAS regions is accomplished with a recipe comprising $CHF_3$, $CF_4$ and $O_2$.

* * * * *